(12) United States Patent
Lei et al.

(10) Patent No.: US 8,710,402 B2
(45) Date of Patent: Apr. 29, 2014

(54) METHOD OF AND APPARATUS FOR LASER DRILLING HOLES WITH IMPROVED TAPER

(75) Inventors: Weisheng Lei, Portland, OR (US); Hisashi Matsumoto, Hillsboro, OR (US); Gregg Hardy, Portland, OR (US); Yunlong Sun, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1544 days.

(21) Appl. No.: 11/757,253

(22) Filed: Jun. 1, 2007

(65) Prior Publication Data
US 2008/0296273 A1   Dec. 4, 2008

(51) Int. Cl.
*B23K 26/00*   (2014.01)
*B23K 26/08*   (2014.01)

(52) U.S. Cl.
USPC .................................. 219/121.71; 219/121.78

(58) Field of Classification Search
USPC ............... 219/121.85, 121.61, 121.71, 121.7, 219/121.78, 121.83
See application file for complete search history.

(56) References Cited

U.S. PATENT DOCUMENTS

| | | | | |
|---|---|---|---|---|
| 5,593,606 | A * | 1/1997 | Owen et al. | 219/121.71 |
| 5,656,186 | A * | 8/1997 | Mourou et al. | 219/121.69 |
| 5,841,099 | A * | 11/1998 | Owen et al. | 219/121.69 |
| 6,211,485 | B1 * | 4/2001 | Burgess | 219/121.7 |
| 6,333,485 | B1 * | 12/2001 | Haight et al. | 219/121.68 |
| 6,433,301 | B1 | 8/2002 | Dunsky et al. | |
| 6,479,788 | B1 | 11/2002 | Arai et al. | |
| 6,610,960 | B2 * | 8/2003 | De Steur et al. | 219/121.71 |
| 6,627,844 | B2 | 9/2003 | Liu et al. | |
| 6,791,060 | B2 | 9/2004 | Dunsky et al. | |
| 6,946,091 | B2 * | 9/2005 | Nakai et al. | 264/400 |
| 7,605,343 | B2 | 10/2009 | Lei et al. | |
| 2002/0040893 | A1 * | 4/2002 | Arai et al. | 219/121.71 |
| 2003/0213787 | A1 | 11/2003 | Dunsky et al. | |
| 2005/0127478 | A1 * | 6/2005 | Hiatt et al. | 257/621 |
| 2005/0265408 | A1 | 12/2005 | Lei et al. | |

FOREIGN PATENT DOCUMENTS

| | | |
|---|---|---|
| JP | 2002-217551 A | 8/2002 |
| JP | 2002-261422 | 9/2002 |
| JP | 2006-231376 | 9/2006 |

OTHER PUBLICATIONS

International Search Report of PCT/US2008/065224.
The International Preliminary Report on Patentability of PCT/US2008/065224.
English language translation of Oct. 15, 2013 office action concerning Japanese Patent Application No. 2010-510506, which corresponds to the subject U.S. Appl. No. 11/757,253.

* cited by examiner

*Primary Examiner* — Sang Y Paik

(57) ABSTRACT

A method of and an apparatus for drilling blind vias with selectable tapers in multilayer electronic circuits permit forming electrical connections between layers while maintaining quality and throughput. The method relies on recognizing that the top diameter of the via and the bottom diameter of the via, which define the taper, are functions of two separate sets of equations. Simultaneous solution of these equations yields a solution space that enables optimization of throughput while maintaining selected taper and quality using temporally unmodified Q-switched $CO_2$ laser pulses with identical pulse parameters. Real time pulse tailoring is not required; therefore, system complexity and cost may be reduced.

20 Claims, 5 Drawing Sheets

METHOD OF AND APPARATUS FOR LASER DRILLING HOLES WITH IMPROVED TAPER

TECHNICAL FIELD

The present disclosure relates to laser processing a workpiece and, more particularly, to a method of and an apparatus for laser drilling holes in multilayer electronic substrates for the purpose of forming vias to permit electrical interconnections between the layers. Specifically, the disclosure relates to laser drilling holes with selectable taper in a workpiece.

BACKGROUND INFORMATION

Nearly all currently manufactured electronic products, including devices such as computers, cell phones and other consumer electronics, are constructed by attaching electronic components to substrates. Electronic components include integrated circuits, passive devices, displays and connectors. Substrates function to hold the electronic components in place and provide electrical connections between the components with desired mechanical, thermal and electrical properties. Substrates typically include an electrically non-conductive layer or layers combined with electrically conductive elements that function electrically in cooperation with the electronic components. Materials that form the non-conductive layers can include crystalline materials such as silicon or sapphire, amorphous materials such as non-crystalline silicon or glass, sintered ceramic materials such as aluminum oxide, or organic materials such as FR-4, polyimide, or ABF, or combinations of the preceding materials. Conductors are formed on or in the substrate by processes including photolithographically depositing conductive materials such as polysilicon, aluminum or copper, depositing conductive inks using screen print or ink jet technologies, or laminating and/or patterning conductive layers on or in the substrate.

What these processes have in common is the need to interconnect electrical conductors that may be separated by layers of electrically nonconductive material. Electronic substrates are typically made up of conductive and nonconductive layers arranged in a planar fashion. FIG. 1 shows a schematic diagram of a multilayer substrate made up of electrically conductive or inorganic layers 10, 12 and 14, separated by electrically nonconductive or organic layers 20, which may contain one or more reinforcing layers 24.

The performance of a laser via drilling system is evaluated according to several criteria, including throughput, accuracy and via quality. Factors that determine via quality include location, shape, debris and taper. Taper refers to the shape and angle of the via side walls. Side wall taper is important because, following drilling, vias are typically plated with an electrically conductive material such as copper to electrically connect layers of a multilayer substrate. High taper, where the walls are relatively parallel, allows the plating to be of high quality and durable.

Drilling high quality vias with a specific taper is highly desirable because it makes it easy to provide good electrical and mechanical contact between the conductor at the bottom of the via and the conductor at the top. Furthermore, providing a good, textured surface, free from debris or remaining organic "smear," enables good electrical contact between the bottom conductor and the plating, further improving the via quality. At the same time, it is desirable to maintain as high a system throughput as possible, meaning that as little time as possible should be taken to drill a via. Given a maximum repetition rate of a laser, this usually means drilling the via with as few pulses as possible, consistent with desired taper and quality. And finally, it is desirable to deliver a system and method to accomplish the above at a reasonable cost and complexity.

U.S. Pat. No. 6,479,788 of Arai, et al., assigned to Hitachi Via Mechanics, Ltd., attempted to solve this problem by varying the pulse width of substantially square pulses as the via is being drilled. The difficulty with this approach is that it requires very precise control of the laser pulses at very high speed. Since today's lasers may exceed 30,000 pulses per second, this system requires control and optics capable of modifying pulses with possible nanosecond resolution at very high power at very high pulse rates, which likely reduces the system reliability and increases cost. It would be desirable then, to achieve the desired taper, quality and throughput without requiring elaborate real time control of each pulse.

There is a continuing need for an apparatus for laser drilling vias in electronic assemblies that is capable of forming vias with high taper, while maintaining acceptable system throughput, accuracy and overall quality.

SUMMARY OF THE DISCLOSURE

An object of the present disclosure is, therefore, to provide a method and an apparatus in the form of a laser processing system with improved ability to micromachine high taper vias in workpieces comprising electronic substrates.

In one embodiment, via taper and quality are controlled by adjusting laser pulse parameters to yield the desired result. In the case where a blind via is being drilled through organic material to reach a non-organic layer within the substrate, via drilling can be divided into two phases. In the first phase, organic material is removed from the via with as few pulses as possible while maintaining the desired top diameter of the via. In the second phase, remaining organic material from the bottom of the via is removed while maintaining the desired bottom diameter and without causing damage to the inorganic conductor at the bottom of the via. It is an object to determine a single set of laser pulse parameters that can effect drilling for both the first and second phases of this process and thereby achieve greater efficiency in the drilling process.

Laser pulse parameters that may be adjusted to achieve the effects noted above include pulse energy, pulse fluence, pulse duration, pulse repetition rate, number of pulses, pulse spot size, pulse temporal shape, pulse spatial distribution, and wavelength. An object is to provide a method and an apparatus to select a single set of laser pulse parameters that can be used for both phases of drilling for a single via. By using a single set of parameters, the control architecture of the system can be simplified because it does not have to alter parameters on the fly during drilling. Drilling efficiency is also potentially increased, in instances where parameters take longer than the inter-pulse interval of the laser, which would require that some pulses be discarded rather than being used to machine the workpiece.

The angle of the side wall is an important determinant of via quality. Assuming that the side wall is of the desired straight topology, side wall angle or taper is measured as the ratio of the diameter of the bottom of the hole to the diameter of the top of the hole, expressed as a percentage. FIG. 2 shows a via 30 with a taper of about 75%, where the exposed conductor at the bottom of the via 30 has a diameter that is approximately 75% of the diameter of top of the via. FIG. 2 shows a via having a plating 36 that electrically connects conductor 10 to conductor 12. One reason taper is important is that low taper makes the plated via more susceptible to thermal stress caused by the differences in coefficients of thermal expansion between the various materials used. Vias with low taper exhibit cracking and delamination of plating at a much greater rate than vias with high taper. Side walls should be straight and not exhibit taper where the bottom of the hole has a larger diameter than the top. Another determinant of blind via quality is the presence or preferably absence of a "foot" of organic material at the bottom of the hole where the side wall meets the bottom conductor. The absence of a foot is important because one of the determinants of the quality of the plating is related to the area of conductor plated at the via bottom.

Via drilling can be accomplished by irradiating the surface of the substrate with one or more laser pulses having predetermined pulse parameters directed to substantially the same location on the substrate. The diameter of the laser pulse is on the order of the size of the via to be drilled. Each of the one or more pulses removes material from the hole until the desired layer is reached. At this point, if it is determined that there exists organic material at the bottom of the via to be removed, one or more laser pulses with the same set of predetermined pulse parameters will be directed at the same location to clean the remaining organic material from the bottom of the via while maintaining the desired bottom diameter of the hole.

DETAILED DESCRIPTION OF PREFERRED EMBODIMENTS

A preferred $CO_2$ processing laser is a pulsed $CO_2$ laser operating at a wavelength of between about 9 μm and about 11 μm. An exemplary commercially available pulsed $CO_2$ laser is the Model Q600 Q-switched laser (9.3 μm) manufactured by Coherent-DEOS of Bloomfield, Conn. Because $CO_2$ lasers are unable to effectively drill vias through metal layers 12 and 14, multilayer workpieces 10 drilled with $CO_2$ processing lasers either lack metal layers 12 and 14 or are prepared such that a target location has been pre-drilled with a UV laser or pre-etched using another process such as, for example, chemical etching, to expose dielectric layers 20.

Figure 1:
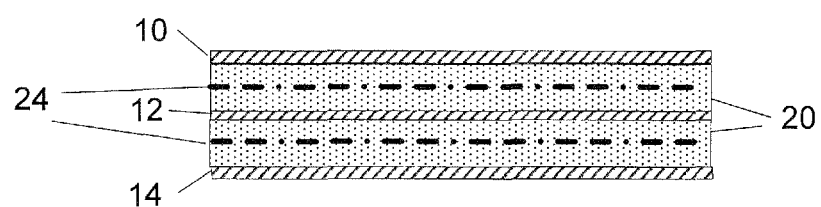
FIG. 1 is a cross-sectional view of a multilayer workpiece.
Figure 2:
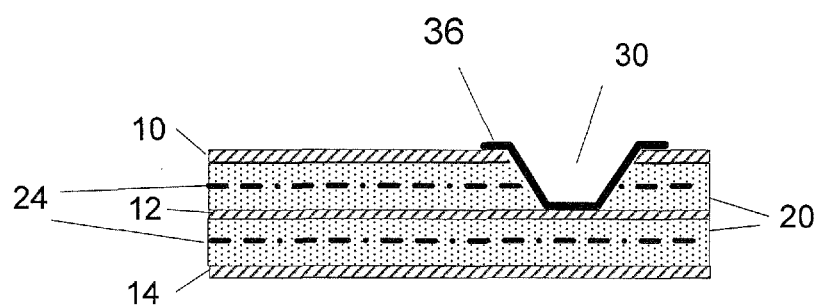
FIG. 2 is a schematic diagram showing a plated via in the workpiece of FIG. 1.
Figure 3:
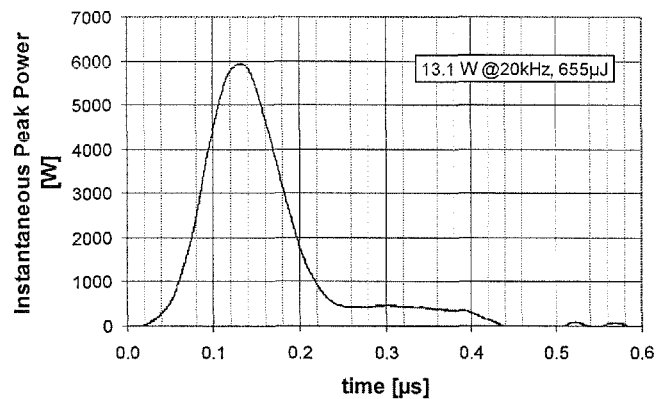
FIG. 3 is a graph of a $CO_2$ laser pulse with a Gaussian temporal distribution.

$CO_2$ Q-switched lasers exhibit a temporal profile that is typically described as "Gaussian," although examination of FIG. 3 shows that the essentially Gaussian pulse is modified by the "tail," which represents energy leakage from the laser cavity as the lasing activity falls off. Research by the applicants indicates that this pulse shape may be effectively used to drill high taper vias in multilayer material. Gaussian temporal distribution is distinguished from Gaussian spatial distribution, which is a function of the laser pulse cross-section. The laser pulses discussed herein have both Gaussian temporal and spatial distributions. Other solid-state lasants or $CO_2$ lasers operating at different wavelengths may be used in the disclosed laser apparatus. Various types of laser cavity arrangements, harmonic generation of the solid state laser, Q-switch operation for the solid-state laser and the $CO_2$ laser, pumping schemes, and pulse generation methods for the $CO_2$ laser are also contemplated. For cases in which non-Q-switched lasers are used, additional pulse shaping optics may be used to form shorter pulses from longer pulses, up to and including lasers operating in continuous wave (CW) mode.

Figure 4:
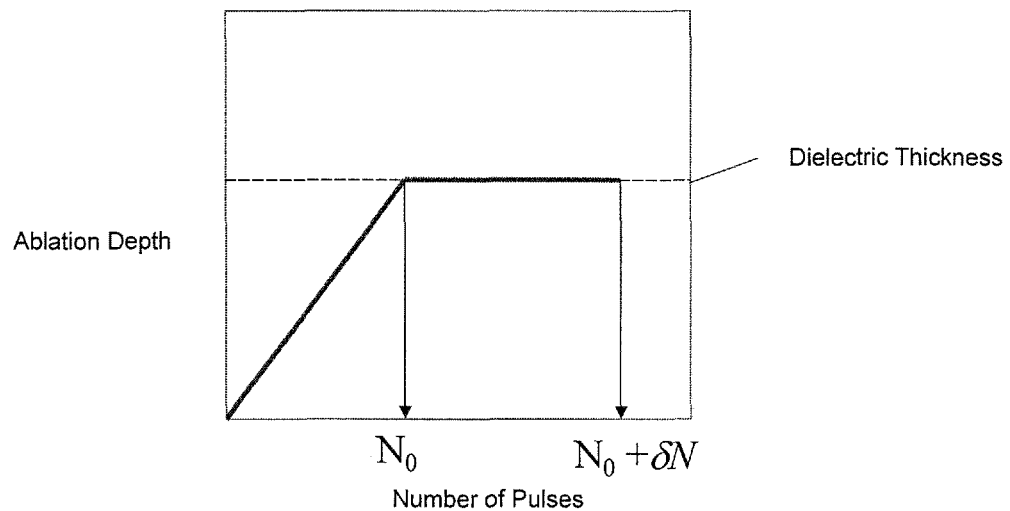
FIG. 4 is a graph showing material removal during via drilling.

FIG. 4 shows a graph of material removal during the via drilling process. The X-axis represents ablation depth and the Y-axis represents number of pulses. As shown in FIG. 4, pulses 0 to $N_0$ remove bulk material from the via, reaching the underlying inorganic conductor at pulse $N_0$. Optional δN pulses then are used to clean the remaining organic material from the bottom of the via. $N_0$ can typically range from 1 to several tens or hundreds of pulses, depending upon the pulse parameters such as fluence and wavelength and amount of material to be removed. δN can typically range from 0 to several tens or hundreds of pulses, again depending upon the pulse parameters and amount of material to be removed.

For $CO_2$ laser interaction with organic polymers, material removal is realized mainly through laser induced thermal degradation, which can occur before reaching the vaporization point. It is possible that some vaporization can occur through the phase transitions (solid-glassy state-melt-vapor). Since for $CO_2$ laser irradiation, the absorption depth of polymer is about 10 μm, which indicates that the laser beam can penetrate into polymers to substantial depths as to cause volumetric heating rather than surface heating only.

Current drilling practice has shown that a single laser pulse can remove explosively the whole layer of ABF resin of around 35 μm in thickness on copper pad. However, to achieve a good via shape, it is preferred to remove the bulk resin material by a group of short pulses, with each pulse removing only a fraction of total depth of material gently rather than explosively, which gives better control over the volumetric heating process.

To a first-order approximation, the ablation rate per pulse ($\chi$) for a Gaussian $CO_2$ laser pulse to ablate polymer through thermal decomposition can be expressed as:

$$\chi = k_0 \cdot F \cdot \sqrt{1 + \frac{k_1}{I}} \quad (1)$$

where $k_0$ and $k_1$ are coefficients related to material constants, F is fluence, I is peak power intensity. For a given peak power intensity I, the ablation depth per pulse $\chi$ is controlled by the fluence, F. Fluence can be approximated by multiplying peak power intensity I by pulse width τ:

$$D_r \approx F = I\tau \quad (2)$$

Figure 5:
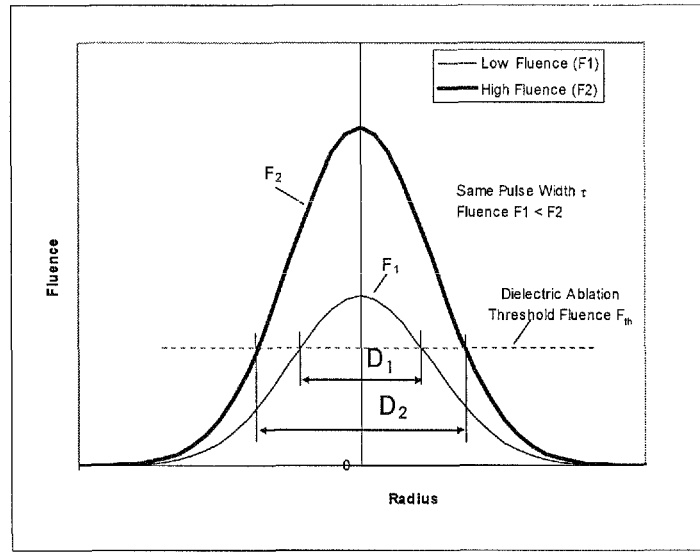
FIG. 5 is a graph showing the relationship between laser pulse energy and via top diameter for pulses with Gaussian spatial distribution.

Fluence is a principal determinant of via top diameter. As fluence increases, material removal becomes more explosive and less controlled, particularly for Gaussian temporal pulses. FIG. 5 shows a cross-sectional view of the spatial distribution of fluence of a laser pulse with essentially Gaussian spatial beam distribution. For a given material, the size of the hole is related to the per-pulse fluence. Applicants' experimental results show that, for a given spot size, there is a small range of fluence values that will yield a desired via top diameter. This is illustrated in FIG. 5, where $D_1$ and $D_2$ are the via top diameters drilled with two different pulse fluences. As can be seen, for fluence $F_1$, the pulse energy exceeds the dielectric ablation threshold for a diameter $D_1$, whereas the pulse with fluence $F_2$ exceeds the dielectric threshold for a diameter $D_2$, thereby drilling a hole with that top diameter.

Figure 6:
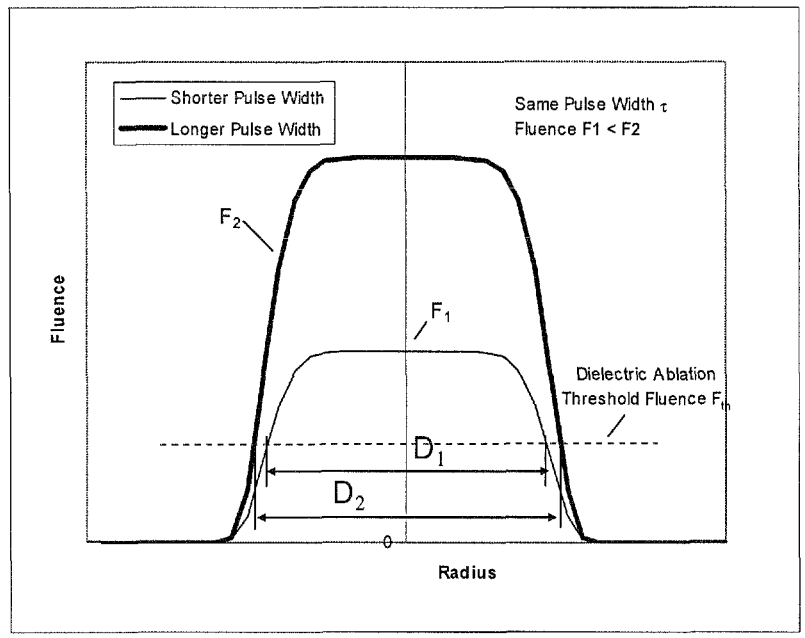
FIG. 6 is a graph showing the relationship between laser pulse energy and via top diameter for pulses with "top hat" spatial distribution.

This principle applies to beam spatial distributions other than the Gaussian distribution. Laser pulses with "top hat" distributions can be used to drill vias as described in U.S. Pat. Nos. 6,433,301 and 6,791,060 of Dunsky et al., each of which is incorporated herein by reference. FIG. 6 shows a cross-sectional view of pulses with top hat spatial distributions. As shown in FIG. 6, laser pulses with top hat spatial distributions exhibit a relationship between fluence, ablation and via top diameter similar to that of the Gaussian spatial distribution.

Another principle of via drilling relates to the size and quality of the bottom of the via. In contrast to the via top diameter, the bottom diameter is not simply a function of the fluence. Complicating the drilling is the existence of the non-organic layer that forms the bottom of the via. This non-organic layer is typically comprised of copper, but could include other conductive material. This layer can alter the via drilling process in several ways: First, the non-organic layer tends to reflect the laser energy rather than absorb it, as does the organic material. This reflected energy can cause unwanted erosion of the organic layers resulting in undercutting of the organic layers, which makes the taper negative, an unwanted result. The organic conductor also acts as a heat sink, conducting heat away from the via as it is being drilled. This cooling of the bottom of the via encourages vaporized organic material to re-deposit on the bottom, thereby preventing the subsequent plating from making complete electrical contact with the conductive material at the bottom of the contact. Also, the non-organic layer can be partly melted by the laser pulses used to drill the via, causing the bottom of the via to assume a smooth, glassy appearance, in contrast to the typical nodular or rough appearance. This smoothness makes it more difficult for the subsequent plating to attach to the bottom of the via and can prevent good electrical contact. All of these effects are related to the bottom diameter, either directly or indirectly.

Figure 7:
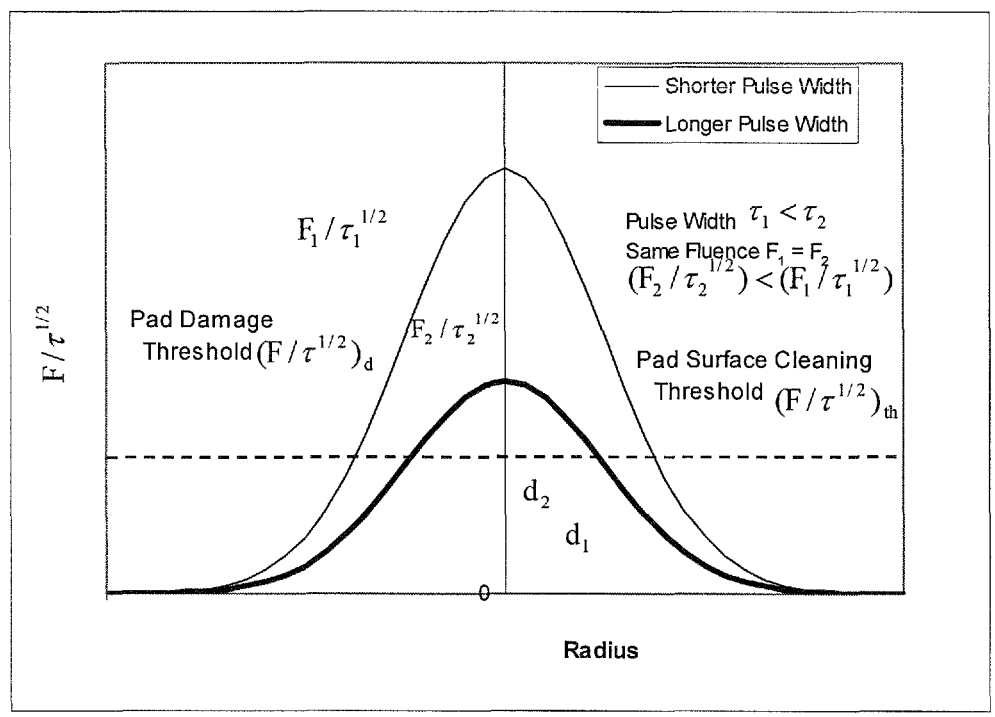
FIG. 7 is a graph showing the relationship between laser pulse energy and via bottom diameter.

It is important then, to apply the correct amount of power when the laser pulses reach the intended bottom of the via in order to achieve the correct diameter without causing ill effects. Applicants' research indicates that the bottom diameter of the via is a function of the following equation:

$$D_b \approx F/\tau^{1/2}, \quad (3)$$

which shows that $D_b$, the diameter of the bottom of the via, is proportional to the fluence F, divided by the square root of the pulse width, $\tau$. FIG. 7 shows the relationship between the diameter of the bottom of the via, damage to the bottom of the via and the fluence divided by the square root of the pulse width. As can be seen from FIG. 7, the fluence and pulse width must be adjusted to be able to achieve the desired bottom diameter while avoiding damage to the pad, or bottom of the via.

A solution to the problem of laser drilling a via with desired top and bottom diameters while avoiding damage to the bottom of the via can be arrived at by simultaneously solving equations (1) and (3) with the additional constraint given by:

$$D_b = (T)D_t, \quad (4)$$

where $D_b$ and $D_t$ are the desired bottom and top diameters and T is the taper, expressed as a fraction between −1 and +1. Since the fluence is a function of both pulse width and peak power intensity, there exists more than one solution to the above equations. In fact, a range of pulse widths and peak power intensities exist that will solve the problem. Within this solution space, a particular pulse width and peak power will be selected that tends to minimize the amount of time spent drilling, i.e., minimizes the number of pulses required to drill the via, and is consistent with the capabilities of the laser and optics selected.

Figure 8:
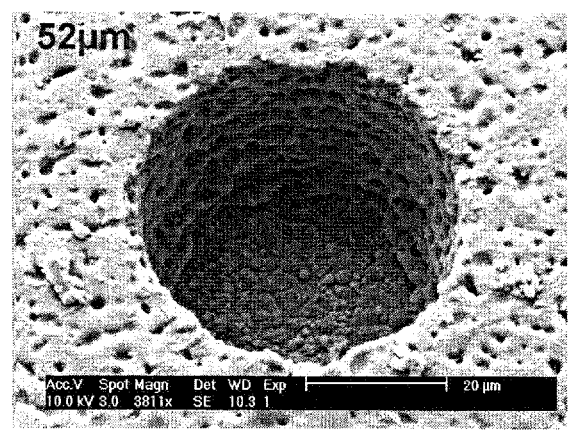
FIG. 8 is a diagram showing a via drilled in accordance with the methods described herein.

FIG. 8 shows a via drilled in a multilayer substrate using laser pulses calculated by the above methods. The substrate organic material is ABF GX3 (Anjinomoto Co. Ltd., Tokyo, Japan) with a copper non-organic pad at the bottom of the via. The drilled via has a top diameter of 53 microns and a taper of 80%. The via was drilled with a CW Q-switched 2.4 W peak power intensity $CO_2$ laser model Q-600 referenced above, operating at a pulse repetition rate of 30 KHz. Five pulses were required to drill the via as shown. As can be seen in FIG. 8, the via is free from debris, and the bottom of the via exhibits a texture that indicates it has not been melted or otherwise damaged.

It will be apparent to those of ordinary skill in the art that many changes may be made to the details of the above-described embodiments of this invention without departing from the underlying principles thereof. The scope of the present invention should, therefore, be determined only by the following claims.

The invention claimed is:

1. A method of using laser pulses to form a blind via in an electronic substrate that includes conductive and dielectric layers, said method comprising:

specifying a top diameter and a bottom diameter for said via, wherein said blind via has a depth between said top diameter and said bottom diameter, wherein a ratio of said bottom diameter to said top diameter expressed as a percentage defines a taper of said blind via, and wherein said blind via has a volume corresponding with said top diameter, said bottom diameter, said depth, and said taper;

calculating a single set of pulse parameters for said laser pulses based on said top diameter and said bottom diameter, wherein forming said blind via includes a first via formation phase including top via formation circumstances for removing dielectric material above said conductive layer while maintaining said top diameter for said via, wherein forming said blind via includes a second via formation phase including bottom via formation circumstances for removing remaining dielectric material at and above said conductive layer while maintaining said bottom diameter for said via without causing substantial damage to said conductive layer, wherein said top and bottom via formation circumstances are different, wherein said top diameter is related to fluence by the equation $D_t \approx F$, where $D_t$ is said top diameter and F is said fluence, wherein said bottom diameter is related to fluence and pulse width by the equation $D_b \approx F/(t^{1/2})$, where $D_b$ is said bottom diameter and t is said pulse width, wherein the laser pulses are provided by a laser system having optical and laser capabilities, wherein said single set of pulse parameters is selected to be within the optical and laser capabilities of the laser system, wherein said single set of pulse parameters pulse parameters includes a pulse width and a peak power, and wherein said pulse width and said peak power are selected to minimize an amount of time spent forming said blind via;

producing and directing for incidence on said electronic substrate said laser pulses characterized by said single set of pulse parameters pulse parameters employed for both the first via formation phase and the second via formation phase to remove said dielectric layer within said volume to form said blind via without causing substantial damage to said conductive layer material.

2. The method of claim 1, in which a taper of said via is greater or equal to about 75%.

3. The method of claim 1, in which said top and bottom diameters are between about 20 microns and about 500 microns.

4. The method of claim 1, wherein one of said pulse parameters includes fluence.

5. The method of claim 4, wherein calculating said pulse parameters for said laser pulses comprises optimizing equations that relate said top diameter and said bottom diameter to at least one of the pulse parameters.

6. The method of claim 4, wherein said pulse width is between about 1 ns and about 100 ns and said fluence is between about 1.0 J/cm$^2$ and about 10.0 J/cm$^2$.

7. The method of claim 1, further comprising directing said one or more laser pulses characterized by said calculated pulse parameters to substantially the same location on the electronic substrate to remove said portion of said dielectric layer to form said via.

8. The method of claim 1, wherein said laser pulses are produced by a Q-switched $CO_2$ laser.

9. The method of claim 1, wherein said single set of pulse parameters satisfies the equation: $X=k_0 \times F \times (1+k_1/I)^{1/2}$, wherein X represents ablation rate per laser pulse, wherein I represents intensity for said peak power, and wherein $k_0$ and $k_1$ represent coefficients related to material constants.

10. The method of claim 1, wherein said blind via has a bottom at said conductive layer, wherein said single set of pulse parameters prevents unwanted erosion of dielectric material at said bottom of said volume and prevents said bottom diameter from being greater than said top diameter.

11. The method of claim 1, wherein said blind via has a bottom at said conductive layer, wherein said single set of pulse parameters prevents unwanted melting of said conductive layer at said bottom and prevents said conductive layer from assuming a smooth glassy appearance.

12. The method of claim 1, wherein said single set of pulse parameters is selected to minimize a number of said laser pulses employed for forming said blind via.

13. The method of claim 1, wherein said single set of pulse parameters prevents debris from settling within the blind via.

14. A system for forming a blind via in an electronic substrate that includes a conductive layer and a dielectric layer, wherein said blind via has a depth between said top diameter and said bottom diameter, wherein a ratio of said bottom diameter to said top diameter expressed as a percentage defines a taper of said blind via, and wherein said blind via has a volume corresponding with said top diameter, said bottom diameter, said depth, and said taper, the system comprising:
a Q-switched $CO_2$ laser operative to produce laser pulses that propagate along a laser beam path and that are characterized by a single set of pulse parameters;
laser beam optics operative to direct said laser pulses to impinge upon said electronic substrate, wherein forming said blind via includes a first via formation phase including top via formation circumstances for removing dielectric material above said conductive layer while maintaining said top diameter for said via, wherein forming said blind via includes a second via formation phase including bottom via formation circumstances for removing remaining dielectric material at and above said conductive layer while maintaining said bottom diameter for said via without causing substantial damage to said conductive layer, wherein said top and bottom via formation circumstances are different, wherein said top diameter is related to fluence by the equation $D_t \approx F$, where $D_t$ is said top diameter and F is said fluence, wherein said bottom diameter is related to fluence and pulse width by the equation $D_b \approx F/(t^{1/2})$, where $D_b$ is said bottom diameter and t is said pulse width, wherein said single set of pulse parameters is selected to be within capabilities of said Q-switched $CO_2$ laser and said laser beam optics, wherein said single set of pulse parameters pulse parameters includes a pulse width and a peak power, and wherein said pulse width and said peak power are selected to minimize an amount of time spent forming said blind via; and
a controller operative to calculate said single set of pulse parameters operable for both the first via formation phase and the second via formation phase based on a top diameter and a bottom diameter intended for said blind via, and to direct said Q-switched $CO_2$ laser to produce said laser pulses characterized by said single set of pulse parameters to remove said dielectric material within said volume to form said volume of said blind via without causing substantial damage to said conductive layer at a bottom of said blind via.

15. The system of claim 14, in which a taper of said via is greater than or equal to 75%.

16. The system of claim 14, in which said top and bottom diameters are between about 20 microns and about 500 microns.

17. The system of claim 14, wherein one of said pulse parameters includes fluence.

18. The system of claim 17, wherein calculating said pulse parameters for said laser pulses comprises optimizing equations that relate said top diameter and said bottom diameter to at least one of the pulse parameters.

19. The system of claim 17, wherein said pulse width is between about 1 ns and about 100 ns and said fluence is between about 1.0 J/cm$^2$ and about 10.0 J/cm$^2$.

20. The system of claim 14, wherein said single set of pulse parameters satisfies the equation: $X=k_0 \times F \times (1+k_1/I)^{1/2}$, wherein X represents ablation rate per laser pulse, wherein I represents intensity for said peak power, and wherein $k_0$ and $k_1$ represent coefficients related to material constants.

* * * * *